United States Patent
Liu

(10) Patent No.: US 11,901,024 B2
(45) Date of Patent: Feb. 13, 2024

(54) METHOD AND DEVICE FOR TESTING MEMORY CHIP

(71) Applicant: CHANGXIN MEMORY TECHNOLOGIES, INC., Hefei (CN)

(72) Inventor: Dong Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 84 days.

(21) Appl. No.: 17/851,656

(22) Filed: Jun. 28, 2022

(65) Prior Publication Data

US 2023/0268019 A1  Aug. 24, 2023

Related U.S. Application Data

(63) Continuation of application No. PCT/CN2022/086403, filed on Apr. 12, 2022.

(30) Foreign Application Priority Data

Feb. 18, 2022  (CN) .......................... 202210153533.8

(51) Int. Cl.
G11C 29/12  (2006.01)

(52) U.S. Cl.
CPC .................. *G11C 29/12005* (2013.01); *G11C 2029/1202* (2013.01); *G11C 2029/1204* (2013.01)

(58) Field of Classification Search
CPC . G11C 29/12005; G11C 29/50; G11C 29/006; G11C 29/50016; G11C 2029/5006; G11C 2029/1204; G11C 2029/1202
See application file for complete search history.

(56) References Cited

U.S. PATENT DOCUMENTS

| | | | | |
|---|---|---|---|---|
| 5,305,261 A | * | 4/1994 | Furutani | G11C 29/025 365/207 |
| 5,519,652 A | * | 5/1996 | Kumakura | G11C 29/50016 365/185.12 |
| 6,016,281 A | | 1/2000 | Brox | |
| 6,105,152 A | | 8/2000 | Duesman | |
| 6,230,292 B1 | | 5/2001 | Duesman | |

(Continued)

FOREIGN PATENT DOCUMENTS

| | | |
|---|---|---|
| CN | 1187677 A | 7/1998 |
| CN | 1220465 A | 6/1999 |

(Continued)

OTHER PUBLICATIONS

Partial Supplementary European Search Report in the European application No. 22731977.9, dated Dec. 22, 2023. 19 pages.

*Primary Examiner* — Tuan T Nguyen

(74) *Attorney, Agent, or Firm* — Cooper Legal Group, LLC

(57) ABSTRACT

A method and a device for testing a memory chip are provided. The method includes: writing test data into memory cells of a memory chip to-be-tested; reading stored data from the memory cells; and generating a test result of the memory chip to-be-tested according to the test data and the stored data; a word line turn-on voltage tested in the memory chip to-be-tested being greater than a standard bit line and word line turn-on voltage of the memory chip to-be-tested, and/or a sense amplification time tested in the memory chip to-be-tested being greater than a standard sense amplification time of the memory chip to-be-tested.

20 Claims, 16 Drawing Sheets

---

Writing test data into memory cells of a memory chip to-be-tested, a word line turn-on voltage tested in the memory chip to-be-tested being greater than a standard bit line and word line turn-on voltage of the memory chip to-be-tested, and/or a sense amplification time tested in the memory chip to-be-tested being greater than a standard sense amplification time of the memory chip to-be-tested — S410

Reading stored data from the memory cells — S420

Generating a test result of the memory chip to-be-tested according to the test data and the stored data — S430

(56) References Cited

U.S. PATENT DOCUMENTS

| | | |
|---|---|---|
| 2010/0182859 A1 | 7/2010 | Kohler |
| 2010/0309726 A1 | 12/2010 | Yang |
| 2012/0236655 A1 | 9/2012 | Yang |
| 2013/0223146 A1 | 8/2013 | Yang |
| 2013/0265836 A1* | 10/2013 | Seningen ......... G11C 29/12015 |
| | | 365/194 |
| 2014/0084936 A1 | 3/2014 | Pan |
| 2014/0126294 A1 | 5/2014 | Yang |
| 2014/0321204 A1 | 10/2014 | Yang |
| 2017/0032850 A1* | 2/2017 | Lim ....................... G11C 29/46 |
| 2018/0108400 A1* | 4/2018 | Choi ................... G11C 11/4091 |
| 2020/0075077 A1 | 3/2020 | Kim et al. |
| 2020/0227132 A1* | 7/2020 | Arai ................... G01R 31/2879 |

FOREIGN PATENT DOCUMENTS

| | | |
|---|---|---|
| CN | 102216999 A | 10/2011 |
| CN | 104810062 A | 7/2015 |
| CN | 110880347 A | 3/2020 |
| CN | 113012745 A | 6/2021 |
| KR | 20120020321 A | 3/2012 |

\* cited by examiner

| First topology | Second topology | Third topology | Fourth topology | Fifth topology | Sixth topology |
|---|---|---|---|---|---|
| 1 | 0 | 1 | 0 | 1 | 0 |
| 0 | 1 | 1 | 0 | 1 | 0 |
| 1 | 0 | 0 | 1 | 1 | 0 |
| 0 | 1 | 0 | 1 | 1 | 0 |
| 1 | 0 | 1 | 0 | 0 | 1 |
| 0 | 1 | 1 | 0 | 0 | 1 |
| 1 | 0 | 0 | 1 | 0 | 1 |
| 0 | 1 | 0 | 1 | 0 | 1 |

FIG. 6

|  WL0 | WL1 | ······ | WLn |
|---|---|---|---|
| 1 | 1 |  | 1 |
| 0 | 0 |  | 0 |
| 1 | 1 |  | 1 |
| 0 | 0 |  | 0 |
| 1 | 1 |  | 1 |
| 0 | 0 |  | 0 |
| 1 | 1 |  | 1 |
| 0 | 0 |  | 0 |
| ⋮ | ⋮ | ⋮ | ⋮ |
| 1 | 1 |  | 1 |
| 0 | 0 |  | 0 |
| 1 | 1 |  | 1 |
| 0 | 0 |  | 0 |
| 1 | 1 |  | 1 |
| 0 | 0 |  | 0 |
| 1 | 1 |  | 1 |
| 0 | 0 |  | 0 |

FIG. 10

| WL0 | WL1 | ...... | WLn |
|---|---|---|---|
| 0 | x | | x |
| 1 | x | | x |
| 0 | x | | x |
| 1 | x | | x |
| 0 | x | | x |
| 1 | x | | x |
| 0 | x | | x |
| 1 | x | | x |
| | | | |
| x | x | | x |
| x | x | | x |
| x | x | | x |
| x | x | | x |
| x | x | | x |
| x | x | | x |
| x | x | | x |
| x | x | | x |
| ⋮ | ⋮ | | ⋮ |

FIG. 11

| WL0 | WL1 | ...... | WLn |
|---|---|---|---|
| 0 | 0 | | x |
| 1 | 1 | | x |
| 0 | 0 | | x |
| 1 | 1 | | x |
| 0 | 0 | | x |
| 1 | 1 | | x |
| 0 | 0 | | x |
| 1 | 1 | | x |
| ⋮ | ⋮ | | |
| 0 | 0 | | x |
| 1 | 1 | | x |
| 0 | 0 | | x |
| 1 | 1 | | x |
| 0 | 0 | | x |
| 1 | 1 | | x |
| 0 | 0 | | x |
| 1 | 1 | | x |
| | | | ⋮ |

FIG. 13

METHOD AND DEVICE FOR TESTING MEMORY CHIP

CROSS-REFERENCE TO RELATED APPLICATION

This disclosure is a continuation application of International Patent Application No. PCT/CN2022/086403, filed on Apr. 12, 2022, which claims priority to Chinese Patent Application No. 202210153533.8, titled with "METHOD AND DEVICE FOR TESTING MEMORY CHIP" and filed on Feb. 18, 2022. The disclosures of International Patent Application No. PCT/CN2022/086403 and Chinese Patent Application No. 202210153533.8 are hereby incorporated by reference in their entireties.

BACKGROUND

In producing a memory, e.g., a Dynamic Random Access Memory (DRAM), d the current leakage between memory cells and word lines of the DRAM often causes the memory cells to fail to store data effectively or completely, and seriously, it may also causes the failure of other memory cells. Therefore, in producing the DRAM, it is necessary to detect the memory cells and the word lines with current leakage therebetween in time.

However, methods in the prior art cannot effectively detect the existence of leakage current, therefore how to effectively detect the memory cell and the word line with current leakage therebetween is still an urgent problem to be solved.

SUMMARY

The disclosure relates to the technical field of memory abnormality test, in particular to a method and a device for testing a memory chip.

In a first aspect, the disclosure provides a method for testing a memory chip, including the following operations.
test data is written into memory cells of a memory chip to-be-tested;
stored data is read from the memory cells; and
a test result of the memory chip to-be-tested is generated according to the test data and the stored data,
herein, a word line turn-on voltage tested in the memory chip to-be-tested is greater than a standard bit line and word line turn-on voltage of the memory chip to-be-tested, and/or a sense amplification time tested in the memory chip to-be-tested is greater than s standard sense amplification time of the memory chip to-be-tested.

In a second aspect, the disclosure provides a device for testing a memory chip, including at least one processor; and a memory. The at least one processor is configured to:
write test data into memory cells of a memory chip to-be-tested;
read stored data from the memory cells; and
generate a test result of the memory chip to-be-tested according to the test data and the stored data,
herein, a word line turn-on voltage tested in the memory chip to-be-tested is greater than a standard bit line and word line turn-on voltage of the memory chip to-be-tested, and/or a sense amplification time tested in the memory chip to-be-tested is greater than s standard sense amplification time of the memory chip to-be-tested.

In a third aspect, the disclosure provides a computer-readable storage medium having stored therein computer-executable instructions that when executed by a processor, implement a method for testing a memory chip, the method includes the following operations.
test data is written into memory cells of a memory chip to-be-tested;
stored data is read from the memory cells; and
a test result of the memory chip to-be-tested is generated according to the test data and the stored data,
herein, a word line turn-on voltage tested in the memory chip to-be-tested is greater than a standard bit line and word line turn-on voltage of the memory chip to-be-tested, and/or a sense amplification time tested in the memory chip to-be-tested is greater than s standard sense amplification time of the memory chip to-be-tested.

BRIEF DESCRIPTION OF THE DRAWINGS

FIG. 6 illustrates a schematic diagram of test data according to an embodiment of the disclosure;

FIG. 10 illustrates a schematic diagram of writing test data according to an embodiment of the disclosure;

FIG. 11 illustrates a schematic diagram of writing test data according to another embodiment of the disclosure;

FIG. 13 illustrates a schematic diagram of writing test data according to another embodiment of the disclosure;

DETAILED DESCRIPTION

Figure 1:
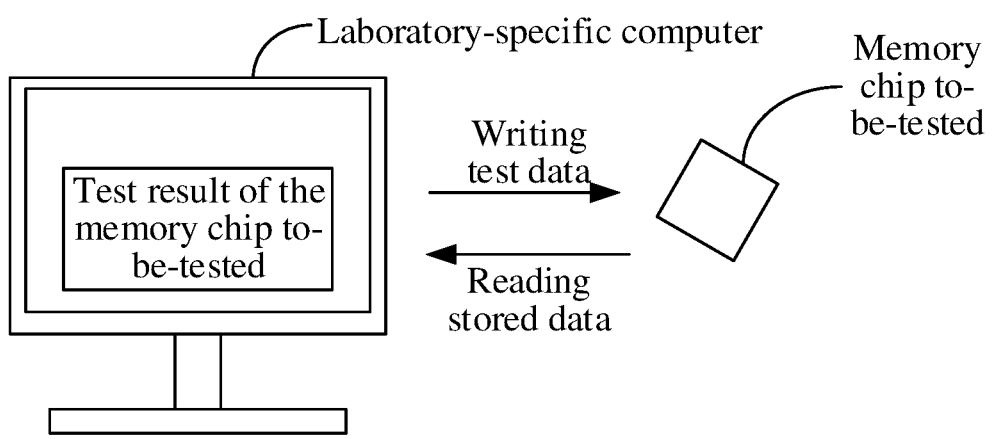
FIG. 1 illustrates a schematic diagram of an application scenario of a method for testing a memory chip according to the disclosure.

To make the objectives, technical solutions and advantages of embodiments of the disclosure to be understood more clearly, the technical solutions of the embodiments of the disclosure will be clearly and completely described with reference to the drawings herein. It is apparent that, the described embodiments are partial but not all embodiments of the disclosure. All other embodiments derived from the embodiments of the disclosure by those of ordinary skill in the art without making inventive efforts shall fall within the scope of the disclosure. Further, the disclosure is illustrated according to one or more illustrative embodiments, and it should be understood that, each aspect of the disclosure may individually be a complete implementation.

It should be noted that, the brief description of terms in the disclosure is merely for a convenient understanding of implementations described below and is not intended to limit the implementations of the disclosure. Unless otherwise defined, the terms should be understood according to the common and ordinary meanings thereof.

Herein, the terms "first", "second", etc. in the description, claims, and the drawings are used to distinguish similar or like objects or entities and not necessarily mean defining a specific order or sequence, unless otherwise defined. It should be understood that, the terms are interchangeable in appropriate implementations, e.g., the terms may be implemented in order other than those in the illustration or description of the embodiments of the disclosure.

Further, the terms "including," and "having" and any variations thereof are intended to mean covering on a non-exclusive basis, e.g., a product or device including a set of components is not necessarily limited to components clearly listed, but may include other components not clearly listed or inherent to the product or device.

Herein, the term "module" used in the disclosure refers to any known or later developed hardware, software, firmware, artificial intelligence, fuzzy logic, or combination of hardware and/or software codes, which can implement a function of a related element.

In producing a memory, e.g., a Dynamic Random Access Memory (DRAM), current leakage between a memory cells and word lines of the DRAM (mainly between a transistor gate electrode and the connected word line in the memory cell) often cause the memory cells to fail to store data effectively or fails completely, and seriously, it may also causes the failure of other memory cells. Therefore, in producing the DRAM, it is necessary to detect the memory cells and the word lines with current leakage therebetween in time.

The disclosure provides a method and a device for testing a memory chip. According to the method, before writing test data into memory cells of a memory chip to-be-tested, a word line turn-on voltage tested in the memory chip to-be-tested is set to be greater than a standard bit line and word line turn-on voltage of the memory chip to-be-tested, and/or a sense amplification time tested in the memory chip to-be-tested is set to be greater than a standard sense amplification time of the memory chip to-be-tested. In this way, after writing the test data into the memory cells of the memory chip to-be-tested, the leakage current effect between word lines connected to the memory cells and the memory cells is enhanced, then the test data written into the memory cells changes. Due to the fact that leakage current may result in changed stored data in the memory cells, a test result of the memory chip to-be-tested can be generated according to the test data and the stored data after reading the stored data from the memory cells.

The method for testing the memory chip according to the disclosure is applied to an electronic device, e.g., a laboratory-specific server, a computer, etc. FIG. 1 illustrates a schematic diagram of an application scenario of the method for testing the memory chip according to the disclosure. As illustrated in FIG. 1, a server writes test data into memory cells of a memory chip to-be-tested, reads stored data from the memory cell after a period of time, and generates a test result of the memory chip to-be-tested according to the test data and the stored data.

Figure 2:
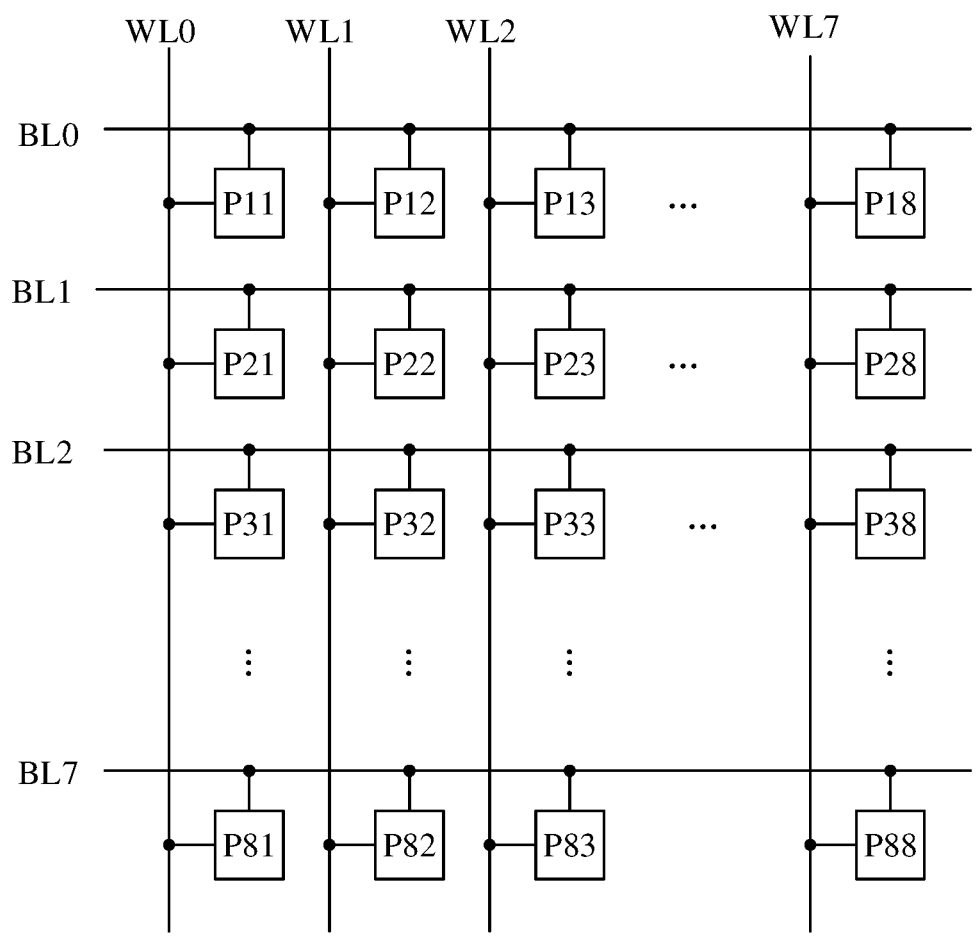
FIG. 2 illustrates a schematic structural diagram of a memory chip to-be-tested according to an embodiment of the disclosure.

With reference to FIG. 2, FIG. 2 illustrates a schematic structural diagram of a memory chip to-be-tested according to an embodiment of the disclosure. According to some embodiments, taking a bank of a DRAM memory as an example, multiple bit lines may be divided into 128 bit line groups, each bit line group has 8 bit lines, and the bit lines in each bit line group are designated as BL0, BL1, BL2 . . . BL7 for a convenient description below. Multiple word lines may be divided into 8192 word line groups, each word line group has 8 word lines, and the word lines in each word line group are designated as WL0, WL1, WL2 . . . WL7 for a convenient description below.

Multiple memory cells P11 to P88 are distributed in a matrix, the memory cells in the first column are all connected to the word line WL0, the memory cells in the second column are all connected to the word line WL1, and so on, and the memory cells in the eighth column are all connected to the word line WL7; and the memory cells in the first row are all connected to the bit line BL0, the memory cells in the second row are all connected to the bit line BL1, and so on, and the memory cells in the eighth row are all connected to the bit line BL7, so that each memory cell is connected to a word line WL and a bit line BL.

Figure 3:
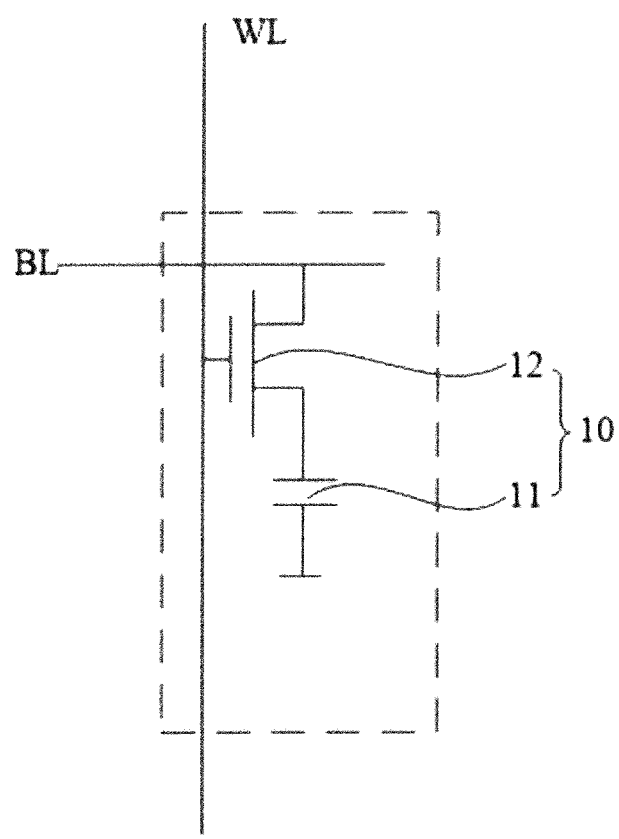
FIG. 3 illustrates a schematic structural diagram of a memory cell according to an embodiment of the disclosure.

With reference to FIG. 3, FIG. 3 illustrates a schematic structural diagram of a memory cell of a memory chip to-be-tested according to an embodiment of the disclosure. Each memory cell 10 includes a transistor 12 and the capacitor 11; a gate electrode of the transistor 12 is connected to a word line WL, a source electrode of the transistor 12 is connected to a bit line BL, and a drain electrode of the transistor 12 is connected to a capacitor 11. It should be noted that, the source electrode of the transistor 12 may further be connected to the capacitor 11, and accordingly, the drain electrode of the transistor 12 is connected to the bit line BL.

According to some embodiments, when a signal on a word line WL switches on a switch transistor T, a bit line BL may write a high level signal "1" into a storage capacitor C, and when a signal on the word line WL switches off the switch transistor T, charges in the storage capacitor C leaks slowly with time. The time of leakage of the storage capacitor C from the high level signal "1" to the low level signal "0" is data storage time of the storage capacitor C. The data storage time of the storage capacitor C needs to be greater than a preset time to realize the dynamic storage function of the dynamic random access memory.

Figure 4:
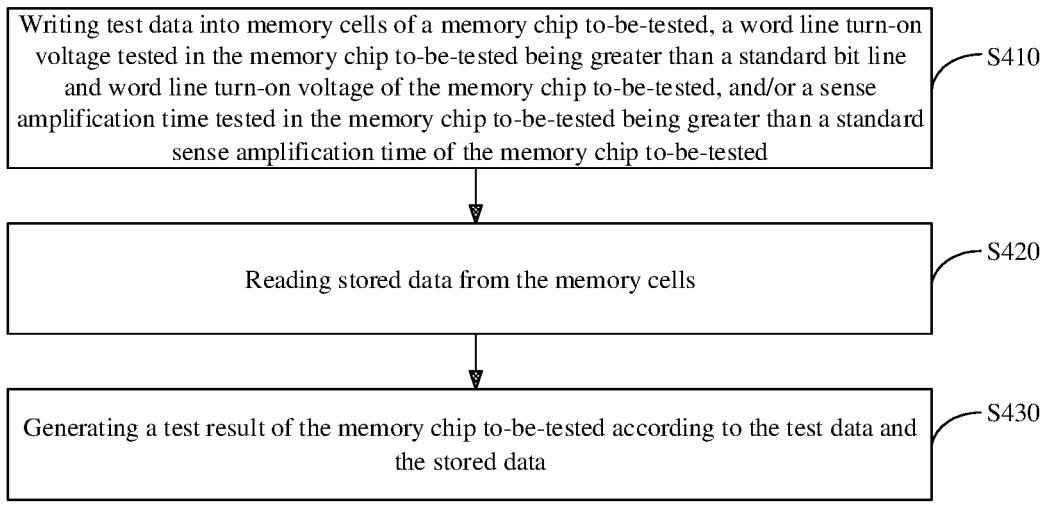
FIG. 4 illustrates a schematic flowchart of a method for testing a memory chip according to an embodiment of the disclosure.
Figure 5:
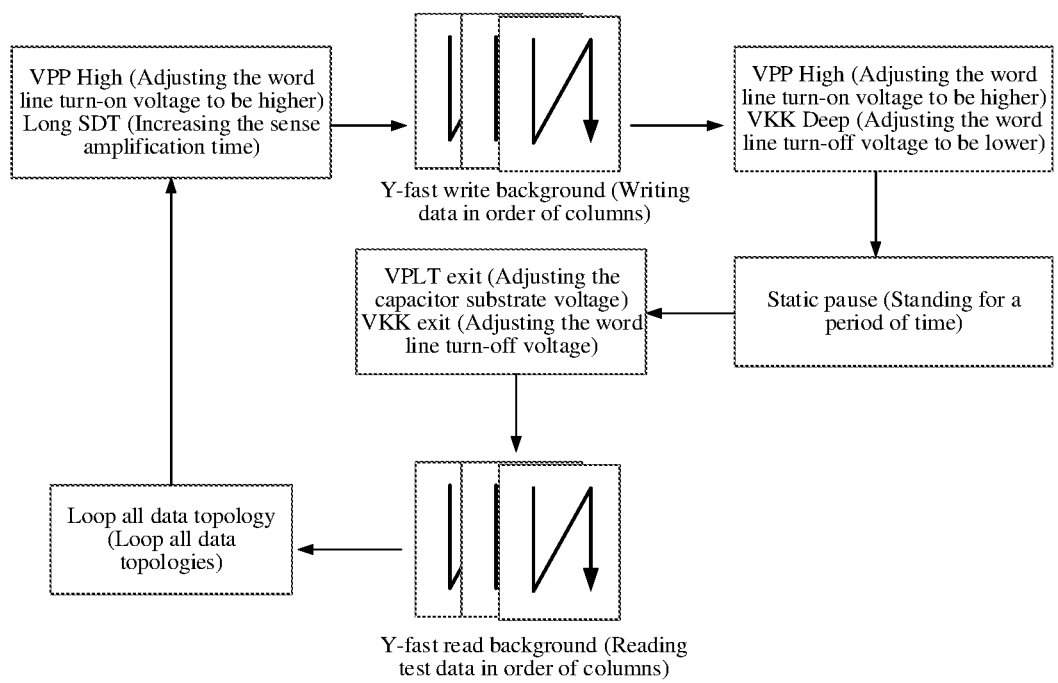
FIG. 5 illustrates another schematic diagram of a method for testing a memory chip according to an embodiment of the disclosure.
Figure 7:
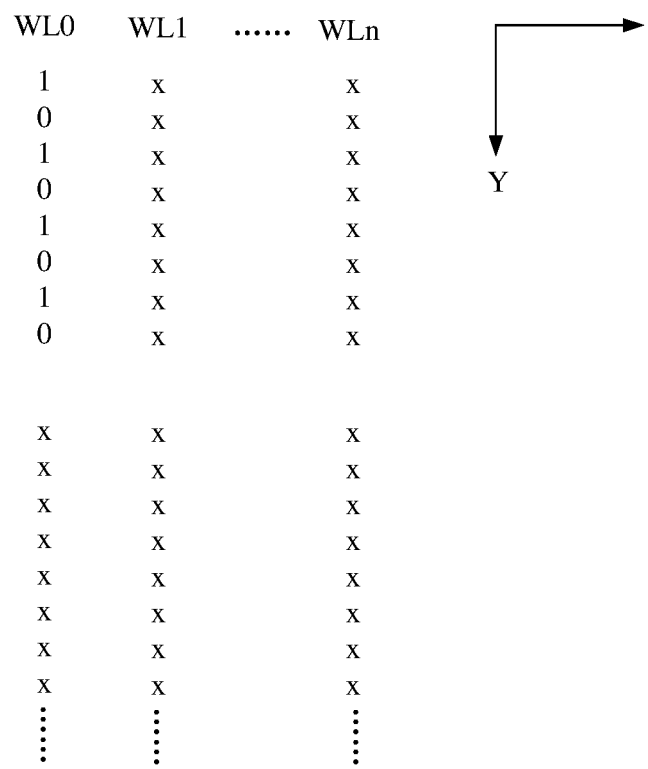
FIG. 7 illustrates a schematic diagram of writing test data according to an embodiment of the disclosure.
Figure 8:
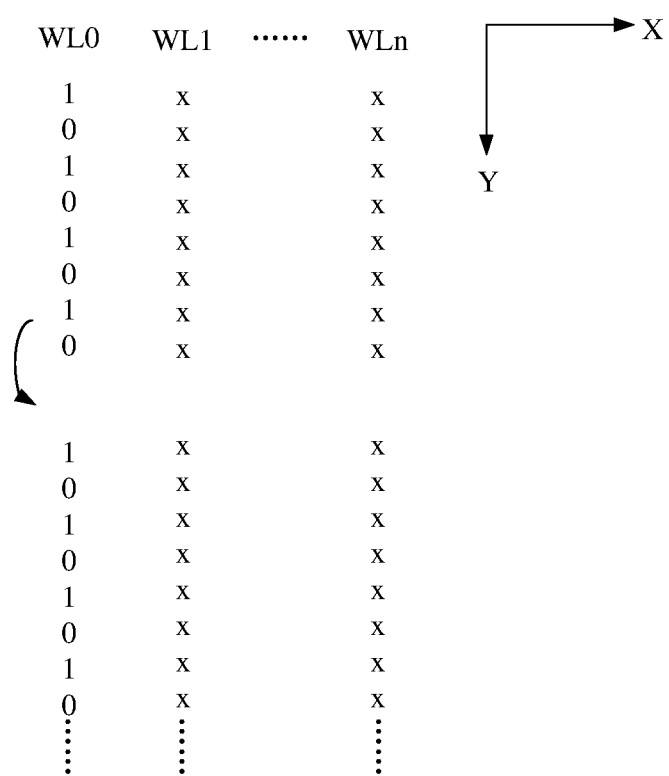
FIG. 8 illustrates a schematic diagram of writing test data according to an embodiment of the disclosure.
Figure 9:
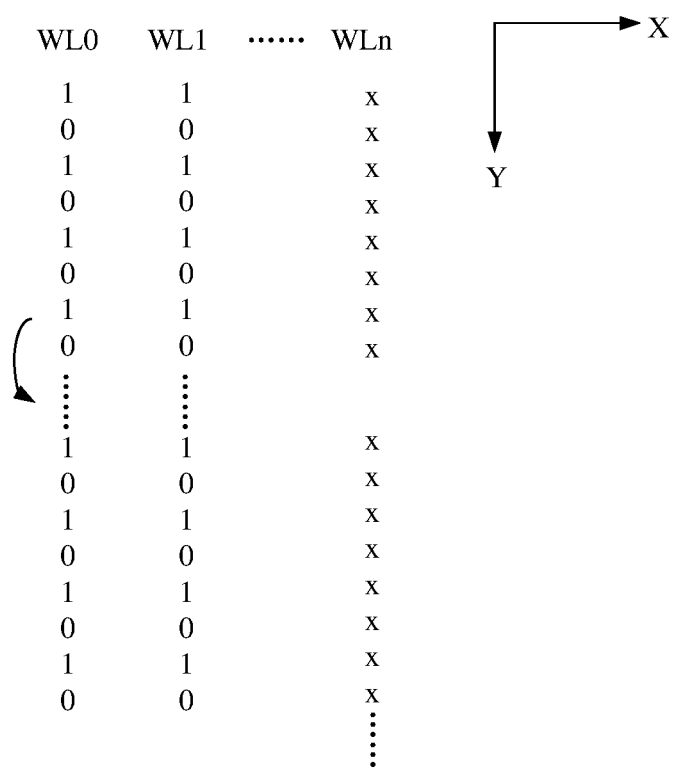
FIG. 9 illustrates a schematic diagram of writing test data according to an embodiment of the disclosure.
Figure 12:
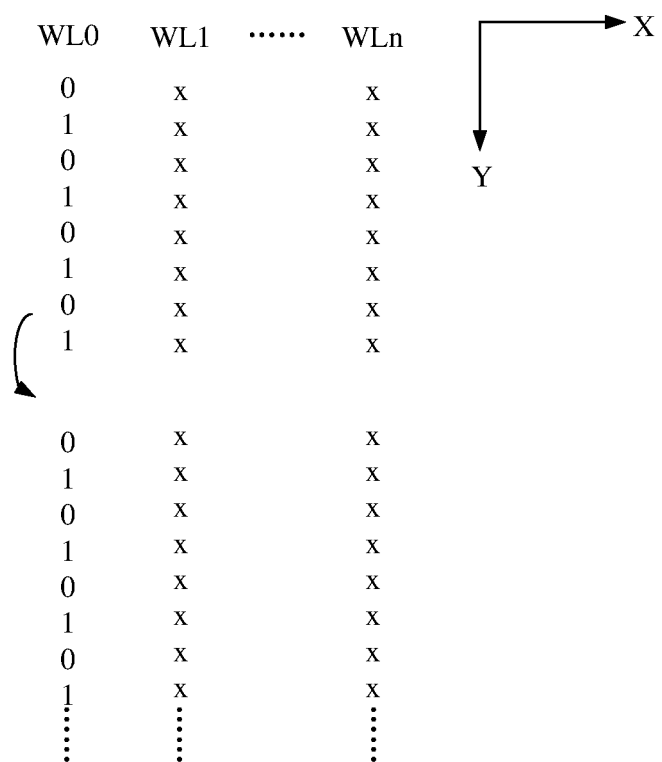
FIG. 12 illustrates a schematic diagram of writing test data according to another embodiment of the disclosure.
Figure 14:
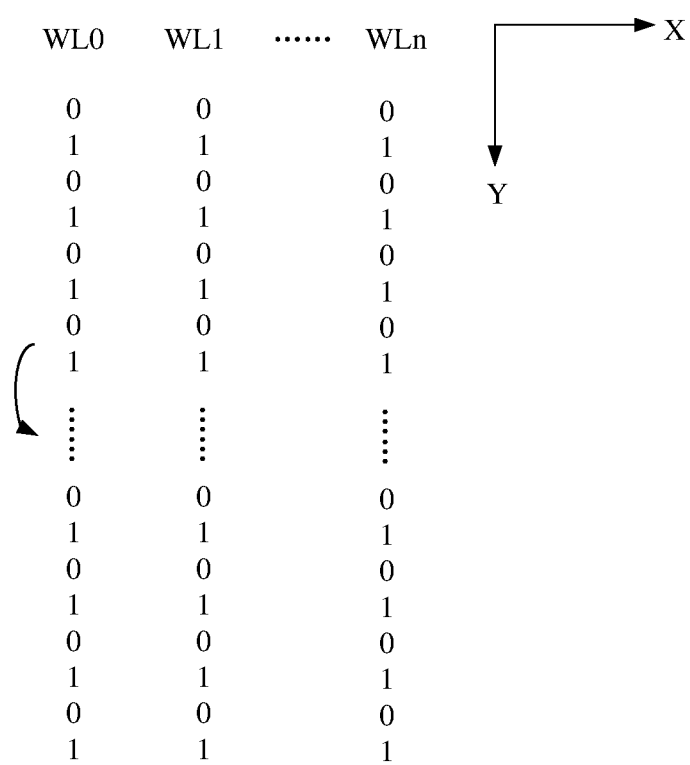
FIG. 14 illustrates a schematic diagram of writing test data according to another embodiment of the disclosure.

With reference to FIG. 4 and FIG. 5, FIG. 4 illustrates a schematic flowchart of a method for testing a memory chip according to an embodiment of the disclosure. The method for testing the memory chip includes the following operations.

At S410, test data is written into memory cells of a memory chip to-be-tested; herein, a word line turn-on voltage tested in the memory chip to-be-tested is greater than a standard bit line and word line turn-on voltage of the memory chip to-be-tested, and/or a sense amplification time tested in the memory chip to-be-tested is greater than standard sense amplification time of the memory chip to-be-tested.

Generally, a current leakage occurs between a gate electrode of a transistor 12 and a connected word line WL. Thus, as illustrated in FIG. 5, before the test data is written into the memory cells of the memory chip to-be-tested, the word line turn-on voltage tested in the memory chip to-be-tested is greater than the standard bit line and word line turn-on voltage of the memory chip to-be-tested, and/or the a sense amplification time tested in the memory chip to-be-tested is greater than the standard sense amplification time of the memory chip to-be-tested.

The word line turn-on voltage refers to a turn-on voltage of the word line to which the memory cell is connected. If there exists a leakage current problem between the memory cell and the connected word line, increasing the turn-on voltage of the word line connected to the memory cell can enhance the leakage current effect between the memory cell and the connected word line, to able that the stored data changes more under the influence of leakage current, thereby being more conducive to judging whether the memory chip to-be-tested has a problem (leakage current problem) through operation S430. For example, a standard bit line and word line turn-on voltage is 2.9V, and an increased word line turn-on voltage of a memory chip to-be-tested is between 2.95V to 3.2V.

The sense amplification time refers to a sense time of a sense amplifier on a bit line. Adjusting the sense amplification time to be greater than standard sense delay time of the memory chip to-be-tested can further create a poor working condition for the memory chip to-be-tested, to able that the part in the memory chip to-be-tested and the part between the memory chip to-be-tested and a word line, which have problems, can be exposed more easily.

Specifically, if there exists a leakage current problem between a memory cell and a connected word line, increasing the sense amplification time can delay the time of reading the stored data in operation S420, to able that the stored data changes more under the influence of leakage current, thereby being more conducive to judging whether the memory chip to-be-tested has a problem (leakage current problem) through operation S430.

If a memory cell to-be-tested has problems, that is, a leakage current between the memory cell and the connected word line will be generated, the leakage current effect between the memory cell and the connected word line will be enhanced after increasing the word line turn-on voltage tested in the memory chip to-be-tested and/or increasing the sense amplification time tested in the memory chip to-be-tested.

If a memory cell to-be-tested has no problems, a current between the memory cell and the connected word line will not be generated, the leakage current effect between the memory cell and the word line connected to the memory cell will not be enhanced after increasing the word line turn-on voltage tested in the memory chip to-be-tested and/or increasing the sense amplification time tested in the memory chip to-be-tested.

Enhancing the leakage current effect between the memory cell and the word line connected to the memory cell can make it easier to judge whether the memory chip to-be-tested is damaged when performing operation S430.

Alternatively, as illustrated in FIG. 5, after writing test data and before reading stored data, a tested word line turn-off voltage is applied to a word line connected to a memory cell, and the tested word line turn-off voltage of the memory chip to-be-tested is less than a standard bit line and word line turn-off voltage of the memory chip to-be-tested.

Alternatively, after writing test data and before reading stored data, a substrate voltage of capacitance is applied to a capacitor terminal in the memory cell (the capacitor is arranged in the memory cell to store data), and the substrate voltage of capacitance tested in a memory chip to-be-tested is greater than a standard substrate voltage of capacitance of the memory chip to-be-tested.

The substrate voltage of capacitance tested in the memory chip to-be-tested is greater than the standard substrate voltage of capacitance of the memory chip to-be-tested, to able that charges leaking from the memory cell and the connected word line are more easily attracted to the capacitor in the memory cell, thereby causing the written test data to change more obviously.

To enhance the leakage current effect, after writing the test data into the memory cell of the memory chip to-be-tested, and before reading the stored data, the tested word line turn-off voltage applied to the word line (which is connected to the memory cell) is less than the standard bit line and word line turn-off voltage of the memory chip to-be-tested, and the substrate voltage of capacitance applied to the capacitor terminal is greater than the standard substrate voltage of capacitance of the memory chip to-be-tested. For example, a standard bit line and word line turn-off voltage is −0.2V, and a tested word line turn-off voltage applied to a word line is −0.5V. For example, a standard substrate voltage of capacitance is 0.5V, and the applied substrate voltage of capacitance is 0.8V.

According to some embodiments, only a word line turn-off voltage tested in a memory chip to-be-tested may be adjusted to be less than a standard bit line and word line turn-off voltage of the memory chip to-be-tested.

According to some embodiments, only a word line turn-on voltage tested in a memory chip to-be-tested may be adjusted to be greater than a standard bit line and word line turn-on voltage of the memory chip to-be-tested.

According to some embodiments, only sense amplification time tested in a memory chip to-be-tested may be adjusted to be greater than a standard sense amplification time of the memory chip to-be-tested.

According to some embodiments, only a substrate voltage of capacitance tested in a memory chip to-be-tested may be adjusted to be greater than a standard substrate voltage of capacitance of the memory chip to-be-tested.

According to some embodiments, a word line turn-off voltage tested in a memory chip to-be-tested may be adjusted to be less than a standard bit line and word line turn-off voltage of the memory chip to-be-tested, and a word line turn-on voltage tested in the memory chip to-be-tested may further be adjusted to be greater than a standard bit line and word line turn-on voltage of the memory chip to-be-tested. When the word line turn-off voltage tested in the memory chip to-be-tested is less than the standard bit line and word line turn-off voltage of the memory chip to-be-tested, and the word line turn-on voltage tested in the memory chip to-be-tested is greater than the standard bit line and word line turn-on voltage of the memory chip to-be-tested, the voltage difference between a memory cell and a connected word line will increase, resulting in the more obvious leakage current effect between the memory cell and the connected word line.

According to some embodiments, a word line turn-off voltage tested in a memory chip to-be-tested is adjusted to be less than a standard bit line and word line turn-off voltage of the memory chip to-be-tested; a word line turn-on voltage tested in the memory chip to-be-tested is adjusted to be greater than a standard bit line and word line turn-on voltage of the memory chip to-be-tested; and a sense amplification time tested in the memory chip to-be-tested is further adjusted to be greater than standard sense amplification time of the memory chip to-be-tested.

According to some embodiments, a word line turn-off voltage tested in a memory chip to-be-tested is adjusted to be less than a standard bit line and word line turn-off voltage of the memory chip to-be-tested; a word line turn-on voltage tested in the memory chip to-be-tested is adjusted to be greater than a standard bit line and word line turn-on voltage of the memory chip to-be-tested; and a substrate voltage of capacitance tested in the memory chip to-be-tested is further adjusted to be greater than a standard substrate voltage of capacitance of the memory chip to-be-tested.

According to some embodiments, the word line turn-on voltage, the word line turn-off voltage, the sense amplification time, and the substrate voltage of capacitance which are tested in the memory chip to-be-tested may be simultaneously adjusted. Specifically, the word line turn-off voltage tested in the memory chip to-be-tested is adjusted to be less than a standard bit line and word line turn-off voltage of the memory chip to-be-tested, the word line turn-on voltage tested in the memory chip to-be-tested is adjusted to be greater than a standard bit line and word line turn-on voltage of the memory chip to-be-tested, the sense amplification time tested in the memory chip to-be-tested is adjusted to be greater than the standard sense amplification time of the memory chip to-be-tested, and the substrate voltage of capacitance tested in the memory chip to-be-tested is adjusted to be greater than a standard substrate voltage of capacitance of the memory chip to-be-tested.

According to some embodiments, the word line turn-off voltage tested in the memory chip to-be-tested may further be adjusted to be equal to the standard bit line and word line turn-off voltage of the memory chip to-be-tested. At this time, the word line turn-on voltage tested in the memory chip to-be-tested may be adjusted to be greater than the standard bit line and word line turn-on voltage of the memory chip to-be-tested. The sense amplification time tested in the memory chip to-be-tested may also be adjusted to be greater than standard sense amplification time of the memory chip to-be-tested. The substrate voltage of capacitance tested in the memory chip to-be-tested may also be adjusted to be greater than a standard substrate voltage of capacitance of the memory chip to-be-tested.

According to some embodiments, the substrate voltage of capacitance tested in a memory chip to-be-tested may also be adjusted to be equal to a standard substrate voltage of capacitance of the memory chip to-be-tested. At this time, the word line turn-on voltage of the memory chip to-be-tested may be adjusted to be greater than the standard bit line and word line turn-on voltage of the memory chip to-be-tested. The sense amplification time of the memory chip to-be-tested may also be adjusted to be greater than the standard sense amplification time of the memory chip to-be-tested. The word line turn-off voltage of the memory chip to-be-tested may also be adjusted to be less than the standard bit line and word line turn-off voltage of the memory chip to-be-tested.

As illustrated in FIG. 5, according to some embodiments of the disclosure, a hold time may further be set after writing test data into memory cells of the memory chip to-be-tested and before reading stored data from the memory cell. The purpose of setting the hold time is such that if there exists leakage current, the leakage amount of leakage current increases over time, thereby influencing more on the test data written into the memory cells. The hold time is between 32 ms and 192 ms, and the hold time is set according to different test solutions.

Alternatively, a substrate voltage of capacitance may be restored to a standard substrate voltage of capacitance and a word line turn-off voltage may be restored to a standard bit line and word line turn-off voltage after the hold time.

Alternatively, a memory chip to-be-tested includes multiple columns of memory cells, and each column of memory cells adopts one or more detection cycles. When test data is written into memory cells of the memory chip to-be-tested, the test data may be written into the memory cells which are in the same detection cycle. Similarly, when stored data is read from memory cells, the stored data is also read from the memory cells which are in the same detection cycle.

Alternatively, each column of memory cells of a memory chip to-be-tested may be tested in a traversal manner along the X-axis direction.

According to some embodiments, the memory chip to-be-tested includes multiple rows of memory cells, and each row of memory cells adopts one or more detection cycles. When test data is written into the memory cells of the memory chip to-be-tested, the test data may be written into the memory cells which are in the same detection cycle. Similarly, when stored data is read from the memory cells, the stored data is also read from the memory cells which are in the same detection cycle.

Alternatively, each row of memory cells of the memory chip to-be-tested may be tested in a traversal manner along the Y-axis direction.

As illustrated in FIG. 2 illustrating a schematic layout diagram of the memory chip to-be-tested, multiple memory cells P11 to P88 are distributed in a matrix, the memory cells in the first column are all connected to the word line WL0, the memory cells in the second column are all connected to the word line WL1, and so on, and the memory cells in the eighth column are all connected to the word line WL7; and the memory cells in the first row are all connected to the bit line BL0, the memory cells in the second row are all connected to the bit line BL1, and so on, and the memory cells in the eighth row are all connected to the bit line BL7, so that each memory cell is connected to the word line WL and a bit line BL.

As illustrated in FIG. 3, the memory cell to-be-tested is a cell having functions of storing data and reading and writing data in the memory chip to-be-tested. Each memory cell includes a transistor (etched transistor) 12 and a capacitor 11. The etched transistor 12 is in a storage state (on or off) through charges of the capacitor 11. The capacitor which stores charges is represent by "1", and the capacitor which stores no charges is represent by "0". The test data may be used to test the memory cells in the memory chip to-be-tested. Due to the fact that the memory chip represents and stores a program and data in binary manner, the test data may be a binary sequence.

Alternatively, the written test data may be binary sequence with equal data bits, and the test data has different data topologies.

As illustrated in FIG. 6, for example, a data topology may include a data topology in which only "0" and "1" are adjacently arranged (e.g. 10101010, 01010101), and may further include a data topology in which 2N "0" and 2N "1" are adjacently arranged (e.g. 11001100, 00110011, 111110000, 00001111, and N is an integer greater than 1). Preferably, the data topology is the data topology which only "0" and "1" are adjacently arranged, which can create a worse environment and make the leakage current effect between the memory cell and the connected word line more obvious.

Alternatively, as illustrated in FIG. 2 illustrating a schematic structural diagram of memory cells of a memory chip to-be-tested, the test data is written into the memory cells of the memory chip to-be-tested in a traversal access manner which is a column writing manner.

Illustratively, writing test data will be illustrated below with reference to FIG. 7 to FIG. 14. As illustrated in FIG. 7 to FIG. 10, a data topology "0" ("10101010") is written into memory cells connected to word lines in order of columns, and as illustrated in FIG. 11 to FIG. 14, a data topology "1" ("01010101") is written into memory cells connected to word lines in order of columns.

As illustrated in FIG. 7 to FIG. 14, when writing, it is written in a group of "10101010" or "01010101", and 8 data are written into each memory cell, i.e., each memory cell will write "10101010" or "01010101".

When writing, each memory cell is cyclically written in order of word lines (WL0 to WLn) in the form of first column and then row. That is, memory cells P11, P21, P31 . . . P81 connected to WL0 write the test data first, then the memory cells P12, P22, P32 . . . P82 connected to WL1 write the test data, etc., and finally the memory cells P1$n$, P2$n$, P3$n$ . . . P8$n$ connected to WLn (e.g., n is 7) write the test data.

When the test data is written into each column of memory cells of the memory chip to-be-tested, the test data is written into each memory cell in the same column in order of bit lines (BL0 to BLn). That is, when the test data is written into memory cells P11, P21, P31, . . . P81 connected to WL0, 8 data ("10101010" or "01010101") are sequentially written into each memory cell in order of P11 to P81. Similarly, when test data is written into memory cells P12, P22, P32 . . . P82 connected to WL1, 8 data ("10101010" or "01010101") are written into each memory cell in order of P12 to P82. By analogy, when test data is written into memory cells P1$n$, P2$n$, P3$n$ . . . P8$n$ connected to WLn (e.g., n is 7), 8 data ("10101010" or "01010101") are written into each memory cell in order of P1$n$ to P8$n$.

As illustrated in FIG. 5, alternatively, after writing test data into memory cells connected to a word line, stored data in the memory cells may be read in order of columns after standing for a period of time. The stored data refers to stored data obtained by reading the written test data from the memory cells of the memory chip, which may be used to check the read-write function of the memory cells. The operation of writing test data and reading stored data is performed cyclically on memory cells connected to each word line, so that the test for the memory chip to-be-tested can be completed.

According to some embodiments above, the leakage current effect of the memory chip to-be-tested can be enhanced before reading stored data by adjusting one or more of the word line turn-on voltage, the word line turn-off voltage, the sense amplification time and the substrate voltage of capacitance applied to a capacitor terminal which are tested in the memory chip to-be-tested.

Generally, the sequence length of the test data is less than or equal to the number of memory cells in the memory chip to-be-tested. It also can be understood that, the number of bits of column memory cells in the memory chip to-be-tested is greater than the number of bits of written data.

Preferably, the number of bits of column memory cells is an integer multiple of the number of bits of written test data. The test data may be cyclically written, then the number of bits of row memory cells in the memory chip to-be-tested is greater than the number of bits of the written test data, and preferably, the number of bits of the row memory cells is an integer multiple of the number of bits of the written test data.

At S420, the stored data is read from the memory cell.

The test data is written into memory cells of the memory chip to-be-tested in a traversal access manner which is a column writing manner; and accordingly, the data is read from the memory cells of the memory chip to-be-tested in a traversal access manner which is a column reading manner.

The operation from writing the test data to reading the stored data is defined as a detection cycle, and each row of memory cells may adopt one or more detection cycles, i.e., each row of memory cells supports writing data and reading data for many times, and the more detection cycles, the higher accuracy of the test.

At S430, a test result of the memory chip to-be-tested is generated according to the test data and the stored data.

As described in operation S410, if there exists leakage current between a memory cell and a connected word line in the memory chip to-be-tested, the test data will change under the influence of leakage current after writing, thereby causing the stored data to be different from the test data. By comparing the test data with the stored data, whether there exists leakage current between the memory cell and the connected word line in the memory chip to-be-tested can be judged, and if there exists the leakage current between the memory cell and the connected word line in the memory chip to-be-tested, it can be judged that the memory chip to-be-tested is a problematic chip.

Further, the test data is compared with the stored data, whether the memory cells of the memory chip to-be-tested have a read-write error is determined according to a comparison result, and the test result of the memory chip to-be-tested is generated according to a determination result of whether the memory cells of the memory chip to-be-tested have the read-write error. If the read-write error occurs, the test result of the memory chip to-be-tested is determined to be that the memory chip to-be-tested is a problematic chip. If no read-write error occurs, or the read-write error occurs within a certain allowable range, the test result of the memory chip to-be-tested is determined to be that the memory chip to-be-tested is a chip without problems.

Further, the test data may be cyclically written into each memory cell of the memory chip to-be-tested. If the memory cells of the memory chip to-be-tested have the read-write error, bits with the read-write error are determined according to the comparison result, the determination of occurring bits with the read-write error may be further used to judge which memory cells in the memory chip to-be-tested has a leakage current problem.

To sum up, the embodiments provide a method for testing a memory chip. Before writing test data into memory cells of a memory chip to-be-tested, a word line turn-on voltage tested in the memory chip to-be-tested is set to be greater than a standard bit line and word line turn-on voltage of the memory chip to-be-tested, and/or the sense amplification time tested in the memory chip to-be-tested is set to be greater than standard sense amplification time of the memory chip to-be-tested. In this way, a worse environment is created for the memory cells of the memory chip to-be-tested, and the leakage current effect can be exposed more easily.

Alternatively, the method may further include that: a tested word line turn-off voltage applied to a word line is set to be less than a standard bit line and word line turn-off voltage, a substrate voltage of capacitance tested in the memory chip to-be-tested is set to be greater than a standard substrate voltage of capacitance, the written test data is set, etc., so that if there is a leakage current problem, more charges are leaked.

In this way, after writing the test data into the memory cells of the memory chip to-be-tested, the leakage current effect between a word line connected to the memory cells and the memory cells is enhanced, so that the test data written into the memory cells changes (the more leakage current, the more changes). Due to the fact that, leakage current may result in the change of stored data in the memory cells (the more leakage current, the more changes), the test result of the memory chip to-be-tested can be generated according to the test data and the stored data after reading the stored data from the memory cells.

As the leakage current effect is enhanced, the existence of the leakage current can be more effectively detected by comparing the written data with the read data, whether the memory chip to-be-tested exists a leakage current problem can be more effectively detected, and which the memory cells and the word lines having current leakage can be effectively detected.

Figure 15:
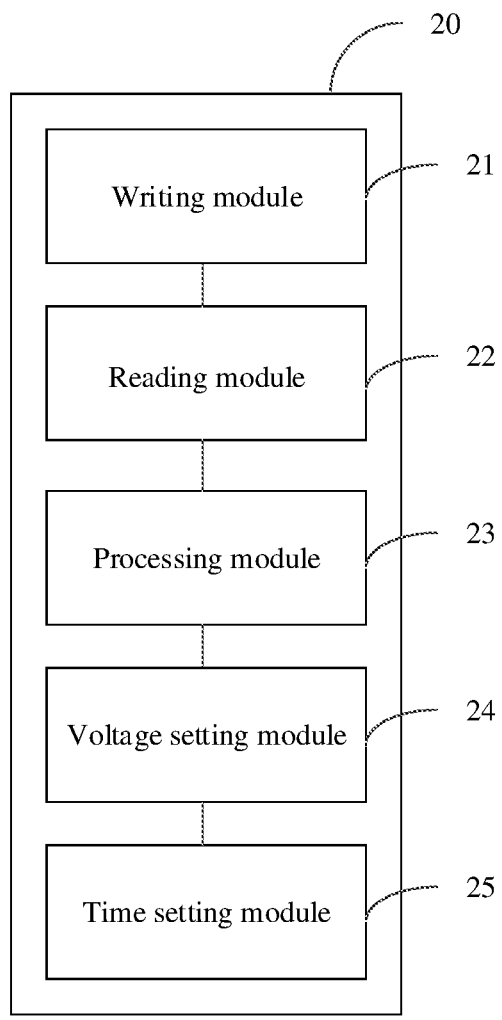
FIG. 15 illustrates a schematic diagram of a device for testing a memory chip according to an embodiment of the disclosure.

With reference to FIG. 15, an embodiment of the disclosure further provides a device 20 for testing a memory chip, including a writing module 21, a reading module 22 and a processing module 23.

The writing module 21 is configured to write test data into memory cells of a memory chip to-be-tested. The test data is written into the memory cells of the memory chip to-be-tested in a traversal access manner which is a column writing manner. The test data may be binary sequences having equal data bits, and the test data has different data topologies. The data topology may include a data topology in which only "0" and "1" are adjacently arranged, and further include a data topology in which 2N "0" and 2N "1" are adjacently arranged (N is an integer greater than 1). The number of bits of row memory cells or column memory cells in the memory chip to-be-tested is greater than the number of bits of the written test data. The number of bits of the row memory cells or the column memory cells is an integer multiple of the number of bits of the written test data.

The reading module 22 is configured to read stored data from the memory cells. The test data is read from the memory cells of the memory chip to-be-tested in a traversal access manner which is a column reading manner. The operation from writing test data to reading stored data is defined as a detection cycle, and each row of memory cells adopts one or more detection cycles.

The processing module 23 is configured to generate a test result of the memory chip to-be-tested according to the test data and the stored data. The processing module 23 is specifically configured to compare the test data with the stored data, and determine whether the memory cells of the memory chip to-be-tested have the read-write error according to a comparison result. If the memory cells of the memory chip to-be-tested have the read-write error, bits with the read-write error therein are determined according to the comparison result; and the test result of the memory chip to-be-tested is generated according to a determination result of whether the memory cells of the memory chip to-be-tested have the read-write error.

The word line turn-on voltage tested in the memory chip to-be-tested is greater than a standard bit line and word line turn-on voltage of the memory chip to-be-tested, and/or the sense amplification time tested in the memory chip to-be-tested is greater than a standard sense amplification time of the memory chip to-be-tested. The word line turn-on voltage of the memory chip to-be-tested is between 2.95V and 3.2V.

The device 20 further includes a voltage setting module 24.

The voltage setting module 24 is configured to apply a tested word line turn-off voltage to a word line and apply a substrate voltage of capacitance to a tested capacitor terminal after writing the test data into memory cells of a memory chip to-be-tested. The word line turn-off voltage tested in the memory chip to-be-tested is less than a standard bit line and word line turn-off voltage of the memory chip to-be-tested; and the substrate voltage of capacitance tested in the memory chip to-be-tested is greater than a standard substrate voltage of capacitance of the memory chip to-be-tested.

Alternatively, the voltage setting module 24 is configured to apply a tested word line turn-off voltage to a word line and apply a substrate voltage of capacitance to a capacitor terminal before reading stored data from the memory cells. The word line turn-off voltage tested in a memory chip to-be-tested is equal to a standard bit line and word line turn-off voltage of the memory chip to-be-tested; and the substrate voltage of capacitance tested in the memory chip to-be-tested is equal to a standard substrate voltage of capacitance of the memory chip to-be-tested.

The word line turn-off voltage tested in the memory chip to-be-tested is −0.5V. The substrate voltage of capacitance applied to the tested capacitor terminal is 0.8V.

The device 20 further includes a time setting module 25.

The time setting module 25 is configured to set hold time after writing the test data into memory cells of the memory chip to-be-tested and before reading stored data from the memory cells.

It should be noted that, the implementation of the writing module 21, the reading module 22, the processing module 23, the voltage setting module 24, and the time setting module 25 according to the embodiments of the disclosure can refer to relevant contents of the embodiments illustrated in FIG. 1 to FIG. 14, which will not be repeated herein.

To sum up, the embodiments provide a device 20 for testing a memory chip. The device 20 is configured to set a word line turn-on voltage of the memory chip to-be-tested to be greater than a standard bit line and word line turn-on voltage of the memory chip to-be-tested, and/or set the sense amplification time of the memory chip to-be-tested to be greater than the standard sense amplification time of the memory chip to-be-tested before writing test data into memory cells of the memory chip to-be-tested. In this way, a worse environment is created for the memory cells of the memory chip to-be-tested, and the leakage current effect can be exposed more easily.

Alternatively, the device may be further configured to set a tested word line turn-off voltage applied to a word line to be less than a standard bit line and word line turn-off voltage, set a substrate voltage of capacitance of a memory chip to-be-tested to be greater than a standard substrate voltage of capacitance, and set written test data, etc., so that if there is a leakage current problem, more charges are leaked.

In this way, after writing the test data into the memory cells of the memory chip to-be-tested, the leakage current effect between the word line connected to the memory cells and the memory cells is enhanced, so that the test data written into the memory cells changes (the more leakage current, the more changes). Due to the fact that leakage current may result in the change of stored data in the memory cells (the more leakage current, the more changes), the test result of the memory chip to-be-tested can be generated according to the test data and the stored data after reading the stored data from the memory cells.

As the leakage current effect is enhanced, the existence of the leakage current can be more effectively detected by comparing the written data with the read data, whether memory chip to-be-tested exists a leakage current problem can be more effectively detected, and which memory cells and word lines having current leakage therebetween can be effectively detected.

Figure 16:
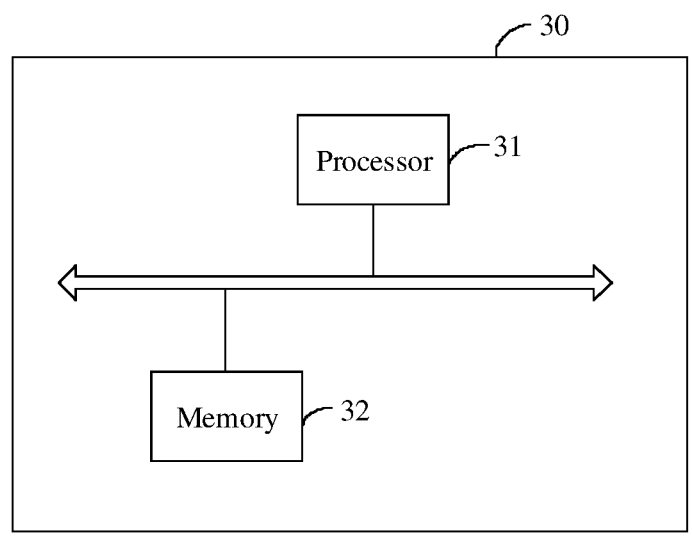
FIG. 16 illustrates a schematic diagram of an electronic device according to an embodiment of the disclosure.

With reference to FIG. 16, the disclosure further provides an electronic device 30, including at least one processor 31 and a memory 32 storing computer-executable instructions. The at least one processor 31 is configured to execute the computer-executable instructions stored in the memory 32 to implement the method for testing the memory chip according to any one of the foregoing embodiments.

Alternatively, a memory 32 may be either independent from or integrated with the processor 31.

The electronic device 30 may further include a bus 33 configured to connect the memory 32 and the processor 31 when the memory 32 is independently arranged.

The disclosure further provides a computer-readable storage medium having stored therein computer-executable instructions that when executed by a processor, implement a method for testing a memory chip according to any one of the foregoing embodiments.

The disclosure further provides a computer program product including a computer program configured to implement a method for testing a memory chip according to any one of the foregoing embodiments.

It should be understood that, the processor may be a Central Processing Unit (CPU), another general-purpose processor, a Digital Signal Processor (DSP), an Application Specific Integrated Circuit (ASIC), etc. The general-purpose processor may be a microprocessor, or any common processor, etc. Steps of the method for testing a memory chip according to the disclosure may be implemented directly by a hardware processor or by combined hardware and software modules in the processor.

The memory may include a high-speed Random Access Memory (RAM), may further include an Non-Volatile Memory (NVM), e.g., at least a magnetic disk, and may further include a USB flash disk, a removable hard disk, a Read-Only Memory (ROM), a magnetic disk or an optical disk, etc.

The bus may be an Industry Standard Architecture (ISA) bus, a Peripheral Component Interconnect (PCI) bus, an Extended Industry Standard Architecture (EISA) bus, etc. Buses may be divided into an address bus, a data bus, a control bus, etc. For convenient illustration, the bus as illustrated in the drawings of the disclosure is not limited to merely one bus or one type of bus.

It should be noted that, the foregoing computer-readable storage medium may be a ROM, a Programmable ROM (PROM), an Erasable Programmable ROM (EPROM), an Electrically Erasable Programmable ROM (EEPROM), a Ferromagnetic Random Access Memory (FRAM), a flash memory, a magnetic platter memory, and an optical disk or Compact Disc ROM (CD-ROM).

Those of ordinary skill in the art should understand that, all or partial steps of the foregoing method embodiments may be implemented by program instructions related to hardware. The foregoing program may be stored in a computer-readable storage medium. The program is executed to implement steps of the foregoing method embodiments; and the foregoing medium may be one capable of storing program codes, e.g., ROM, RAM, magnetic disk, or an optical disk.

According to some embodiments of the disclosure, it should be understood that, the disclosed device and method may be implemented in other ways. Illustratively, the device embodiments described above are merely illustrative, e.g., the modules are merely divided according to logical functions thereof, which may be divided in other ways in actual implementation, e.g., multiple modules may be combined or integrated into another system, or some features may be omitted or not implemented.

Further, each functional module according to any embodiment of the disclosure may be integrated into a processing unit, or each module may be arranged physically alone, or two or more modules may be integrated into one unit. The integrated unit of the foregoing modules may be implemented either in the form of hardware or in the form of a functional unit of hardware and software.

The integrated modules implemented as a functional module of software may be stored in a computer-readable storage medium. The functional module of software may be stored in a storage medium and include instructions enabling a computer device (which may be a personal computer, a server, a network device, etc.) or a processor to implement partial steps of the method according to the embodiments of the disclosure.

It should be noted that, the terms "including", "comprising" or any variations thereof are intended to mean covering on a non-exclusive basis, therefore a process, method, object or device including a set of elements includes not only elements listed but also other elements not explicitly listed, or elements inherent to such a process, method, object or device. Unless otherwise defined, an element defined by "including a/an . . . " does not preclude another same element in the process, method, object or device including the element.

The foregoing serial numbers of the embodiments of the disclosure are for description merely and do not represent any superiority and inferiority of the embodiments.

According to the foregoing description of the embodiments, it is apparent to those skilled in the art that, the method according to the foregoing embodiments may be implemented by means of software with a necessary common hardware platform, and further may be implemented by means of hardware. In many cases, however, the former is preferred. Thereon, the technical solution of the disclosure in essence or the part thereof contributing to the prior art may be embodied as a software product. The computer software product is stored in a storage medium (e.g. ROM/RAM, magnetic disk, and optic disk) and includes instructions enabling a terminal device (which may be a mobile phone, a computer, a server, an air conditioner, or a network device, etc.) to implement the method according to the embodiments of the disclosure.

The disclosure is described with reference to the flowchart and/or block diagrams of the method, device (system), and computer program product according to the embodiments of the disclosure. It should be understood that, each process and/or block in a flowchart and/or block diagram, and a combination thereof may be implemented by computer program instructions. The computer program instructions may be stored in a processor of a general-purpose computer, a special-purpose computer, an embedded processor, or another programmable data processing device to form a machine device, so that the instructions executed by the processor of the computer or another programmable data processing device form a device configured to implement a function specified in one or more steps of a flowchart and/or one or more blocks of a block diagram.

The computer program instructions may further be stored in a computer-readable memory capable of directing a computer or another programmable data processing device to operate in a specific manner, and the instructions stored in the computer-readable memory form a manufactured product including an instruction device to implement the function specified in one or more steps of a flowchart and/or one or more blocks of a block diagram.

The computer program instructions may further be loaded into a computer or another programmable data processing device, therefore a set of steps are implemented in the computer or another programmable data processing device to form a computer-implemented process, and the instructions executed by the computer or another programmable data processing device provide the steps implementing the function specified in one or more steps of a flowchart and/or one or more blocks of a block diagram.

The foregoing embodiments are merely preferred embodiments of the disclosure, and are not intended to limit the scope of the disclosure. Any equivalent structure or process transformation derived from the specification and drawings of the disclosure, or direct and indirect application of the disclosure to other related technical fields, shall fall within the scope of the disclosure.

The invention claimed is:

1. A method for testing a memory chip, comprising:
writing test data into memory cells of a memory chip to-be-tested;
reading stored data from the memory cells; and
generating a test result of the memory chip to-be-tested according to the test data and the stored data,
wherein a word line turn-on voltage tested in the memory chip to-be-tested is greater than a standard bit line and word line turn-on voltage of the memory chip to-be-tested, and/or a sense amplification time tested in the memory chip to-be-tested is greater than a standard sense amplification time of the memory chip to-be-tested.

2. The method of claim 1, further comprising:
after writing the test data into the memory cells of the memory chip to-be-tested, applying a tested word line turn-off voltage to a word line and applying a substrate voltage of capacitance to a tested capacitor terminal,
wherein the word line turn-off voltage tested in the memory chip to-be-tested is less than a standard bit line and word line turn-off voltage of the memory chip to-be-tested; and
the substrate voltage of capacitance tested in the memory chip to-be-tested is greater than a standard substrate voltage of capacitance of the memory chip to-be-tested.

3. The method of claim 1, further comprising:
applying a tested word line turn-off voltage to a word line and applying a substrate voltage of capacitance to a capacitor terminal before reading the stored data from the memory cells, wherein the word line turn-off voltage tested in the memory chip to-be-tested is equal to a standard bit line and word line turn-off voltage of the memory chip to-be-tested; and
the substrate voltage of capacitance tested in the memory chip to-be-tested is equal to a standard substrate voltage of capacitance of the memory chip to-be-tested.

4. The method of claim 1, further comprising:
setting a hold time after writing the test data into the memory cells of the memory chip to-be-tested and before reading the stored data from the memory cells.

5. The method of claim 1, wherein a period from writing the test data to reading the stored data is a detection cycle, wherein each row of the memory cells adopts one or more detection cycles.

6. The method of claim 1, wherein the test data is written into the memory cells of the memory chip to-be-tested in a traversal access manner which is a column writing manner.

7. The method of claim 1, wherein the test data is read from memory cells of the memory chip to-be-tested in a traversal access manner which is a column reading manner.

8. The method of claim 1, wherein the test data is a binary sequence with equal data bits, and the test data has different data topologies.

9. The method of claim 8, wherein the data topologies comprise a data topology in which only "0" and "1" are adjacently arranged, and further comprises a data topology in which 2N "0" and 2N "1" are adjacently arranged, wherein N is an integer greater than 1.

10. The method of claim 6, wherein a number of bits of row memory cells or column memory cells in the memory chip to-be-tested is greater than a number of bits of the written test data.

11. The method of claim 10, wherein the number of bits of the row memory cells or column memory cells is an integer multiple of the number of bits of the written test data.

12. The method of claim 2, further comprising:
determining a target detection result of the memory chip according to the test result, comprising:
comparing the test data with the stored data, and determining whether the memory cells of the memory chip to-be-tested has a read-write error according to a comparison result, and in case that the memory cells of the memory chip to-be-tested have the read-write error, determining bits with the read-write error according to the comparison result; and
generating the test result of the memory chip to-be-tested according to a determination result of whether the memory cells of the memory chip to-be-tested have the read-write error.

13. The method of claim 2, wherein the word line turn-on voltage tested in the memory chip to-be-tested is between 2.95V to 3.2V.

14. The method of claim 2, wherein the word line turn-off voltage of the memory chip to-be-tested is −0.5V.

15. The method of claim 2, wherein the substrate voltage of capacitance applied to the tested capacitor terminal is 0.8V.

16. A device for testing a memory chip, comprising:
at least one processor; and
a memory,
wherein the at least one processor is configured to:
write test data into memory cells of a memory chip to-be-tested;
read stored data from the memory cells; and
generate a test result of the memory chip to-be-tested according to the test data and the stored data,
wherein a word line turn-on voltage tested in the memory chip to-be-tested is greater than a standard bit line and word line turn-on voltage of the memory chip to-be-tested, and/or a sense amplification time tested in the memory chip to-be-tested is greater than a standard sense amplification time of the memory chip to-be-tested.

17. The device of claim 16, wherein the at least one processor is configured to:
after writing the test data into the memory cells of the memory chip to-be-tested, apply a tested word line turn-off voltage to a word line and apply a substrate voltage of capacitance to a tested capacitor terminal,
wherein the word line turn-off voltage tested in the memory chip to-be-tested is less than a standard bit line and word line turn-off voltage of the memory chip to-be-tested; and the substrate voltage of capacitance tested in the memory chip to-be-tested is greater than a standard substrate voltage of capacitance of the memory chip to-be-tested.

18. The device of claim 16, wherein the at least one processor is configured to:
- apply a tested word line turn-off voltage to a word line and apply a substrate voltage of capacitance to a capacitor terminal before reading the stored data from the memory cells, wherein the word line turn-off voltage tested in the memory chip to-be-tested is equal to a standard bit line and word line turn-off voltage of the memory chip to-be-tested; and
- the substrate voltage of capacitance tested in the memory chip to-be-tested is equal to a standard substrate voltage of capacitance of the memory chip to-be-tested.

19. The device of claim 16, wherein the at least one processor is configured to:
- set a hold time after writing the test data into the memory cells of the memory chip to-be-tested and before reading the stored data from the memory cells.

20. A computer-readable storage medium having stored therein computer-executable instructions that when executed by a processor, implement a method for testing a memory chip, wherein the method comprises:

writing test data into memory cells of a memory chip to-be-tested;

reading stored data from the memory cells; and generating a test result of the memory chip to-be-tested according to the test data and the stored data, wherein a word line turn-on voltage tested in the memory chip to-be-tested is greater than a standard bit line and word line turn-on voltage of the memory chip to-be-tested, and/or a sense amplification time tested in the memory chip to-be-tested is greater than a standard sense amplification time of the memory chip to-be-tested.

* * * * *